(12) United States Patent
Brubaker et al.

(10) Patent No.: US 8,330,633 B2
(45) Date of Patent: Dec. 11, 2012

(54) CURRENT STEERING CIRCUIT WITH FEEDBACK

(75) Inventors: James L. Brubaker, Fremont, CA (US); Florin A. Oprescu, Rancho Santa Fe, CA (US)

(73) Assignee: Linear Technology Corporation, Milpitas, CA (US)

( * ) Notice: Subject to any disclaimer, the term of this patent is extended or adjusted under 35 U.S.C. 154(b) by 111 days.

(21) Appl. No.: 13/096,737

(22) Filed: Apr. 28, 2011

(65) Prior Publication Data

US 2012/0274496 A1 Nov. 1, 2012

(51) Int. Cl.
*H03M 1/66* (2006.01)
(52) U.S. Cl. .......................... 341/136; 341/133; 341/144
(58) Field of Classification Search .................. 341/133, 341/136, 144, 153
See application file for complete search history.

(56) References Cited

U.S. PATENT DOCUMENTS

| | | | | |
|---|---|---|---|---|
| 5,373,294 | A * | 12/1994 | Sun | 341/136 |
| 7,023,367 | B1 | 4/2006 | Manganaro | |
| 7,629,910 | B2 * | 12/2009 | Ramadoss et al. | 341/136 |
| 7,701,370 | B2 * | 4/2010 | Lee | 341/136 |
| 7,714,756 | B2 * | 5/2010 | Huang et al. | 341/136 |
| 8,063,808 | B2 * | 11/2011 | Yamazaki et al. | 341/136 |
| 2006/0061499 | A1 | 3/2006 | Seo | |
| 2011/0037511 | A1 | 2/2011 | Tokumaru | |

FOREIGN PATENT DOCUMENTS

EP  1653623 A1  3/2006

OTHER PUBLICATIONS

Extended European Search Report, 12 pages.

* cited by examiner

*Primary Examiner* — Howard Williams
(74) *Attorney, Agent, or Firm* — Patent Law Group LLP; Brian D. Ogonowsky

(57) ABSTRACT

A differential current steering (CS) circuit uses feedback from the differential output nodes A and B to cause current steering devices (e.g., MOSFETs) to effectively exhibit an infinite output impedance when conducting. Therefore, the signal on the output nodes A or B does not significantly change the voltage at the common node, This is particularly useful when the differential output nodes are connected to differential output buses in a digital-to-analog converter. The circuit dynamically cancels, though feedback, the signal induced at the common node by the signal present at the "steered" output node. Therefore, the CS circuit effectively presents an infinite output impedance between the common node and the output nodes. In some cases, it may be desirable to not create a substantially infinite output impedance for the CS circuit but control the impedance to a predefined level to counter other distortions in the system.

27 Claims, 2 Drawing Sheets

CURRENT STEERING CIRCUIT WITH FEEDBACK

FIELD OF THE INVENTION

This invention relates to current steering circuits that provide a predetermined current to one of two differential output terminals in response to complementary input signals, such as for use in a digital-to-analog converter (DAC).

BACKGROUND

Current steering circuits are the basic building blocks of certain types of digital-to-analog converters (DACs) used in a wide range of applications, such as digital radio transmit signal chains, test equipment stimulus synthesis, wire-line data transmission, and so on. In these applications, a critical DAC specification is the spurious free dynamic range (SFDR), which is directly determined by the amount of undesired distortion unavoidably added to the generated output signal.

FIGS. 1A and 1B illustrate an example of a prior art current steering (CS) circuit 100. A fixed current source 130 is selectively steered towards the output node A or output node B as directed by complementary control signals VCA and VCB.

FIG. 1A shows a first state of the CS circuit 100. A current steering device 110 couples a current source 130 to output node A when signal Von is applied to node 112 through switching element 118, as directed by control signal VCA present at control terminal 111. The current steering device 110 may be any type of suitable device. In some embodiments, the device 110 may be a transistor, including n and p-channel enhancement and depletion MOSFETs, JFETs, MESFETs, heterojunction devices, NPN or PNP bipolar transistors, etc. The switching element 118 may be any type of signal generator that, in response to control signal VCA, provides a suitable bias to the current steering device. At the same time, current steering device 120 decouples current source 130 from output node B when signal Voff is applied to node 122 through the switching element 128, as directed by control signal VCB present at control terminal 121. In this first state of the CS circuit 100, steering device 110 functions in a conductive state while steering device 120 functions in an isolating state.

A second state of the CS circuit 100 is shown in FIG. 1B. The current steering device 110 decouples current source 130 from output node A when signal Voff is applied to node 112 through switching element 118, as directed by control signal VCA. At the same time, current steering device 120 couples current source 130 to output node B when signal Von is applied to node 122 through switching element 128 as directed by control signal VCB. In this second state of the CS circuit, steering device 110 functions in an isolating state while steering device 120 functions in a conductive state.

The relatively low output impedance of steering device 110 in its conductive state is represented by resistor 115 in FIG. 1A. The relatively low output impedance of steering device 120 in its conductive state is illustrated as resistor 125 in FIG. 1B. Both current steering devices (110 and 120) in their isolating state have sufficiently high output impedance such that it can be practically ignored for the purpose of this description.

Because of physical implementation constraints, a relatively substantial parasitic capacitance is present at common node 132 and is illustrated by capacitor 135.

In the first state illustrated by FIG. 1A, a signal present at output node A may change the voltage stored on capacitor 135 through resistor 115. Similarly, in the second state illustrated by FIG. 1B, a signal present at output node B may change the voltage stored on capacitor 135 through resistor 125. Such may be the case where the CS circuit 100 is one of many CS circuits in a DAC applying currents to a differential output bus connected to output nodes A and B.

When the CS circuit 100 transitions from the first state to the second state, the desired steering of current Io from output node A to output node B is accompanied by the undesired transfer to B of charge stored on common node 132 through resistor 115 by the signal present at node A during the first state. Similarly, when the CS circuit 100 transitions from the second state to the first state, the desired steering of current Io from output node B to output node A is accompanied by the undesired transfer to A of charge stored on common node 132 through resistor 125 by the signal present at node B during the second state. This transfer of charge creates distortion, limiting the spurious free dynamic range (SFDR) of the DAC.

FIG. 2 illustrates a DAC 200 constructed from a plurality of current steering circuits CS1, CS2 ... CS(n−1), CSn coupled to differential output nodes A and B. In one embodiment, these CS circuits are scaled (i.e., current sources increase for each bit position according to $2^0$, $2^1$, $2^2$, $2^3$, etc.) and are selectively controlled by complementary pairs of control signals VCA1, VCB1, ... VCAn, VCBn to transition between first and second states at such time and in such sequence as to produce a desired differential output signal at nodes A and B. The differential signal thus produced at the output nodes A and B is an analog equivalent of the incoming control signals. In other embodiments, some or all of the CS circuits may be equal weighted or non-binary weighted or any combination thereof.

Due to the relatively low output impedance (represented by resistors 115 and 125) of the current steering devices 110 and 120 (FIGS. 1A and 1B) in their conductive state, the desired output signal is accompanied by undesired signal-dependent charge transfers, resulting in output signal distortion on nodes A and B.

What is needed is a current steering circuit, such as for use in a DAC, that generates less distortion of the signal at its output nodes.

SUMMARY

A differential current steering (CS) circuit uses feedback to cause the steering devices (e.g., MOSFETs) to effectively exhibit an infinite output impedance (in an ideal embodiment) when conducting. Therefore, the signal on the output nodes A or B does not significantly change the potential at the common node. This is particularly useful when the differential output nodes are connected to differential output buses in a DAC.

In one embodiment, the signal at output node B is scaled as a feedback signal and used to modulate the conventional control voltage for the steering device in the "A" leg when the steering circuit is controlled to steer current to output node A. The signal at node B is effectively the inverse of the signal at node A. The invention uses the inverse variable signal at output node B to cancel (or at least attenuate) the undesirable influence of the signal at output node A on the common node. The scaling (k) of the feedback circuit is designed, selected, and/or adjusted to prevent the variable voltages on the output nodes A and B from significantly changing the voltage at the common node. The result is equivalent to a substantially infinite output impedance for the CS circuit in the first state.

Similarly, the signal at node A is scaled as a feedback signal and used to modulate the conventional control voltage for the steering device in the "B" leg when the steering circuit is controlled to steer the current to the node B. The invention uses the inverse variable signal at output node A to cancel (or at least attenuate) the undesirable influence of the signal at output node B on the common node. The result is equivalent to a substantially infinite output impedance for the CS circuit in the second state.

In some cases, it may be desirable to not create a substantially infinite equivalent output impedance for the CS circuit but control the impedance to a predefined level to counter other distortions in the system. Therefore, the impedance may be intentionally under compensated or over compensated for an overall improved SFDR of the system.

Other embodiments are described.

BRIEF DESCRIPTION OF THE DRAWINGS

Elements that are the same or equivalent are labeled with the same numeral.

DETAILED DESCRIPTION

Figure 3:
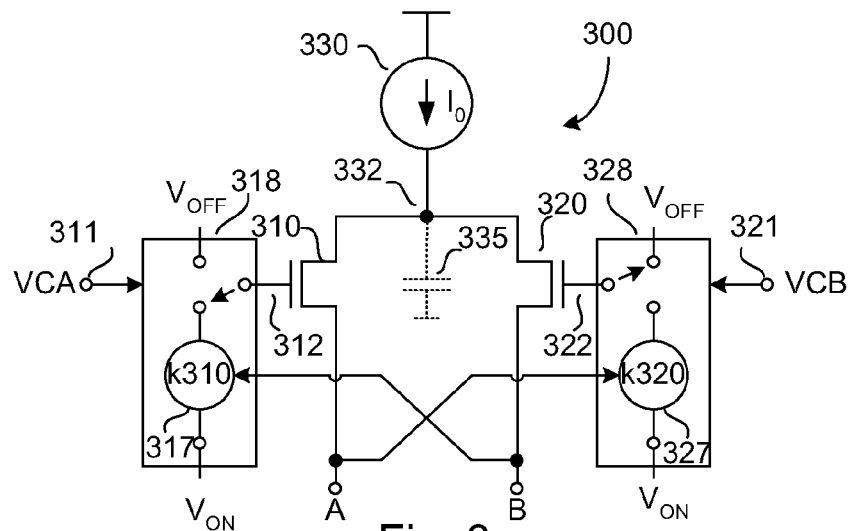
FIG. 3 illustrates a current steering circuit in accordance with one embodiment of the invention.

The invention is an improved current steering circuit. The invention dynamically modulates a current steering device (e.g., a MOSFET, a bipolar transistor, an analog amplifier, or other device) while in its conductive state by using feedback from the differential signals present at the circuit's output nodes A and B, as illustrated in FIG. 3. In this way, the signal on the output node A or B does not significantly influence the potential at the common node. Hence, there is less undesired signal-dependent charge transfer, resulting in less output signal distortion on nodes A and B.

Figure 4:
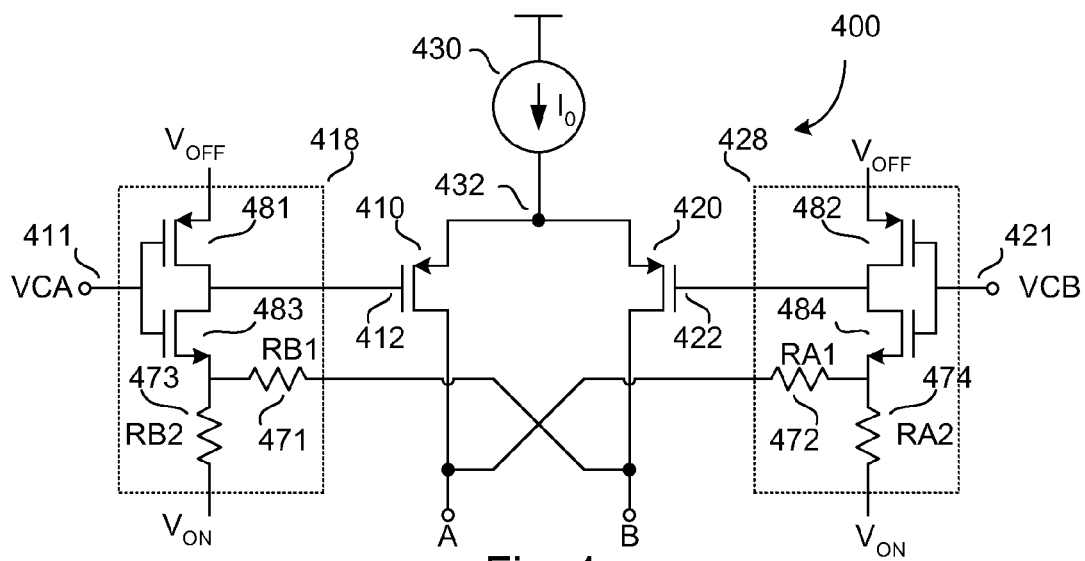
FIG. 4 illustrates a current steering circuit in accordance with another embodiment of the invention.

In the embodiments of FIGS. 3 and 4, the feedback circuitry in the CS circuits 300 and 400 appropriately modulates the signal applied to a steering device (e.g., a PMOS transistor) in its conductive state such as to maintain the voltage at the common node 332 or 432 independent of the signals present at output nodes A and B.

The term Von shown in FIG. 3 represents a signal that is necessary to place the current steering device 310 or 320 in a conductive state, given the potential range expected or allowed at the output nodes A and B. The term Voff shown in FIG. 3 represents a signal that is necessary to place the current steering device 310 or 320 in an isolating (non-conductive) state, given the potential range expected or allowed at the output nodes A and B.

Figure 1A:
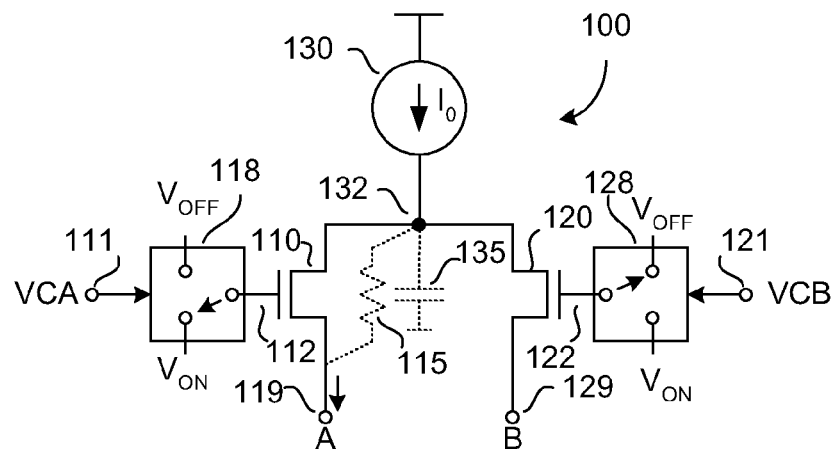
FIG. 1A illustrates a prior art current steering circuit outputting a first differential signal.
Figure 1B:
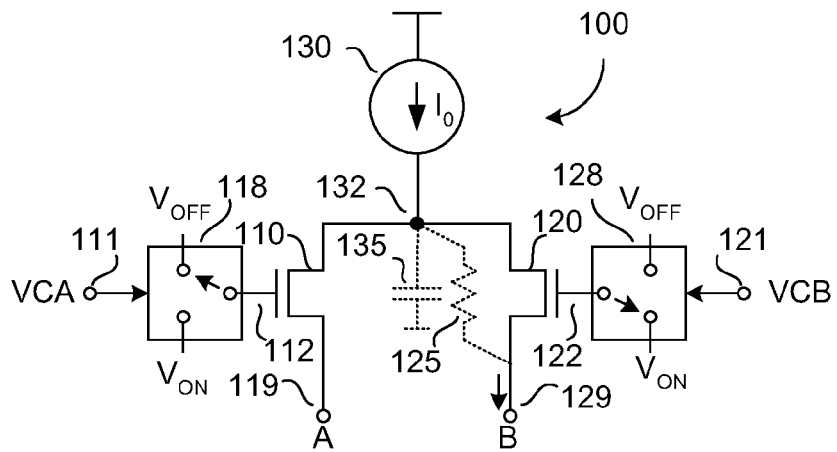
FIG. 1B illustrates the prior art current steering circuit outputting a second differential signal.
Figure 2:
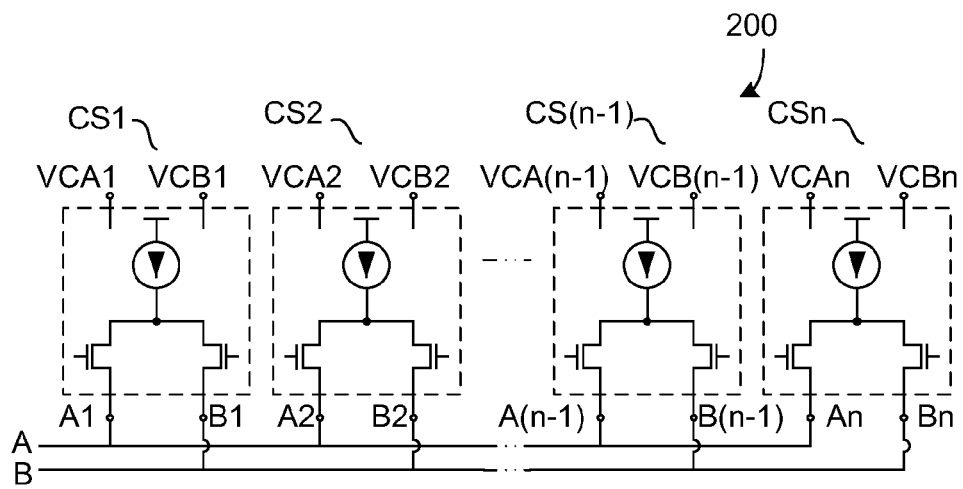
FIG. 2 illustrates a prior art digital-to-analog converter (DAC) with a plurality of current steering circuits where each receives complementary control input signals and outputs an analog signal representative of the control signals.
Figure 5:
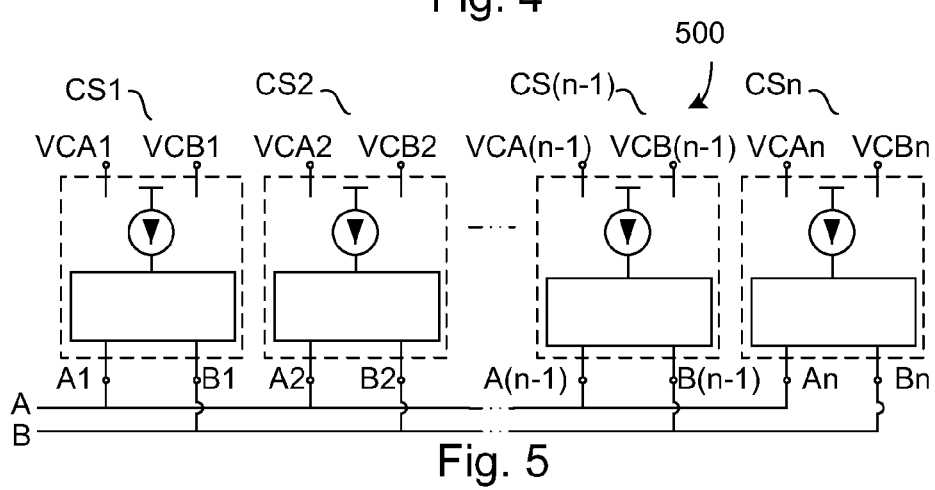
FIG. 5 illustrates a DAC with a plurality of current steering circuits in accordance with one embodiment of the invention.

In FIG. 3, let us assume that control signal VCA causes the switching element 318 to place steering device 310 in a conductive state while control signal VCB causes the switching element 328 to place steering device 320 in an isolating state. Hence the CS circuit 300 is in a first state corresponding to the first state of the CS circuit 100 shown in FIG. 1A, and we will assume a rising signal is applied to output node A by parallel coupled CS circuits configured as illustrated in the DAC of FIG. 5. As a result of the finite impedance of steering device 310, the potential of the common node 332 (having a parasitic capacitance represented by capacitor 335) will normally rise in response (although this effect is countered by the present invention). Simultaneously, due to the differential properties of the signal present at output nodes A and B, the potential of node B is decreasing.

In FIG. 3, the decreasing signal present at node B is shown coupled, through an appropriately scaled feedback circuit 317, to the steering device 310 control node 312. Thus, it reduces the conventional signal at node 312 such as to cancel the effect the increasing signal present at output node A has upon the common node 332. The scaling (k) (or transfer function) of the feedback circuit is designed, selected, and/or adjusted to prevent the variable voltage on the output node A from changing the voltage at the common node 332. The result is equivalent to a substantially infinite output impedance for the CS circuit in the first state.

In a similar fashion, when the CS circuit 300 is switched to its second state, the control signal to the current steering device 320 is modulated by coupling the node A signal through an appropriately scaled feedback circuit 327 to node 322. The varying signal present at output node A proportionally modifies the conventional signal at node 322 of steering device 320 thus mitigating the effect of the inverse varying signal present at output node B. The scaling (k) (or transfer function) of the feedback circuit is designed, selected, and/or adjusted to prevent the variable voltage on the output node B changing the voltage at the common node 332. The voltage at the common node 332 is independent of the voltage levels at nodes A and B due to the feedback. The result is equivalent to a substantially infinite output impedance for the CS circuit 300 in the second state.

A possible implementation of the circuit shown in FIG. 3 uses a voltage controlled signal source as the feedback circuit 317 having a transfer coefficient k310, controlled by the node B signal, superimposed upon signal Von and applied to node 312, as directed by control signal VCA. Thus, in the first state, signal Von+k310*V(B) is applied to node 312 in order to compensate for the effect of the potential at output node A on the common node 332.

Similarly, a voltage controlled signal source may be used as the feedback circuit 327 having a transfer coefficient k320, controlled by the node A signal, superimposed upon signal Von and applied to node 322, as directed by the control signal VCB. As a consequence, in the second state, signal Von+k320*V(A) is applied to node 322 in order to compensate for the effect of the potential at output node B on the common node 332.

By designing, selecting and/or adjusting the transfer coefficients k310 and k320 based respectively upon properties of current steering devices 310 and 320 and the expected differential output signal amplitude, the potential of common node 332 can be maintained to be independent of the signals present at the output nodes A and B. Thus, the CS circuit 300 will appear to exhibit substantially infinite output impedance.

In certain applications it may be advantageous to under compensate or over compensate the effect of the output signal upon the current steering circuit common mode potential. This results in a tweaking of the current steering devices equivalent output impedance to a predefined level, which directly translates into a defined level of distortions introduced by the current steering circuit. Such a distortion control mechanism can be beneficially employed to counterbalance other distortion sources present in a system, resulting in improved overall spurious free dynamic range (SFDR).

Toward this goal, the feedback coefficients (i.e. k310 and k320) may be selected to obtain the desired equivalent output impedance for the current steering devices, which may be different from infinity.

As it is well known in the art, in some applications signals Von and/or Voff may be embedded within the control signals VCA and VCB. In such configurations, VCA and VCB may be scaled analog signals coupled to nodes 312 and 322 through a variety of circuits such as amplifiers.

In some embodiments, the switching elements may be digitally controlled circuits (e.g. switches, transmission gates, . . . etc.) which, as directed by digital complementary control signals VCA and VCB, couple predetermined signals Von and Voff to the current steering devices such as to place them in the desired conductive and respectively isolating states. Thus, the feedback signal may be coupled through the switching element and modulate the predetermined Von signal.

In other embodiments, the switching elements may be analog driven circuits (e.g. amplifiers, buffers, attenuators, passive networks of resistors/capacitors/inductors or combinations thereof, . . . etc.) which translate (e.g. scale) and couple the complementary control signals VCA and VCB to the current steering devices such as to place them in the desired conductive and respectively isolating states. Thus the feedback may be coupled to the control terminals and suitably modulate the complementary control signals VCA and VCB. In such a case, the feedback circuits may scale the VCA and VCB control signals prior to the control signals being applied to a conventional current steering element. Suitable level shifting circuitry is well known. The overall effect is the same as in FIG. 3.

Another embodiment of this invention is illustrated in FIG. 4 by current steering circuit 400. Steering devices 410 and 420 are implemented using p-channel MOS transistors characterized at current Io, generated by current source 430, by transconductance parameters gm410 and gm420, respectively, and by output conductance parameters gds410 and gds420, where gds=id/vds. In such a case, the gate voltages (at node 412, 422) of the MOS transistors are adjusted by the feedback circuits as described below.

Switching elements 418 and 428 are constructed using PMOS and NMOS transistor switch pairs 481, 483 and 482, 484, respectively. The feedback circuits are implemented by resistor dividers RB1, RB2 and RA1, RA2, respectively, comprising resistor pairs 471, 473 and 472, 474, respectively.

During the first state, a "high" VCA control signal present at control node 411 places switch 481 in an isolating state and switch 483 in a conductive state. Consequently signal S412 is coupled to node 412 where:

$S412=Von+(V(B)-Von)*kb=Von*(1-kb)+V(B)*kb$ and $kb=RB2/(RB1+RB2)$.

During the same first state, the complementary "low" control signal VCB present at control node 421 places switch 482 in a conductive state and switch 484 in an isolating state. Thus signal $V_{OFF}$ is coupled to node 422, and steering device 420 is placed in an isolating state.

The potential variation (if any) of the common node 432 potential due to a signal variation v(A) present at output node A in the first state of the CS circuit 400, without the benefit of the present invention, is proportional to v(A)*gds410/gm410. At the same time, due to the differential property of the DAC output signal, the variation v(B) present at output node B is approximately equal to −v(A). Therefore, by selecting kb=RB2/(RB1+RB2) substantially equal to gds410/gm410, the variation of the common node 432 potential due the signal present at output node A during the first state can be eliminated or at least significantly reduced.

During the second state, a "high" VCB control signal present at control node 421 places switch 482 in an isolating state and switch 484 in a conductive state. Consequently signal S422 is coupled to node 422 where:

$S422=Von+(V(A)-Von)*ka=Von*(1-ka)+V(A)*ka$ and $ka=RA2/(RA1+RA2)$.

During the same second state, the complementary "low" control signal VCA present at control node 411 places switch 481 in a conductive state and switch 483 in an isolating state. Thus, signal $V_{OFF}$ is coupled to node 412, and steering device 410 is placed in an isolating state.

The potential variation (if any) of the common node 432 potential due to a signal variation v(B) present at output node B in the second state of CS circuit 400, without the benefit of the present invention, is proportional to v(B)*gds420/gm420. At the same time, due to the differential property of the DAC output signal, the variation v(A) present at output node A is approximately equal to −v(B). Therefore, by selecting ka=RA2/(RA1+RA2) substantially equal to gds420/gm420, the variation of the common node 432 potential due to the signal present at output node B during the second state can be eliminated or at least significantly reduced.

One skilled in the art will recognize that this is a first order derivation of the feedback coefficients required in order to attain the desired substantially infinite output impedance for the current steering devices. A practical implementation presents a number of well documented higher order effects (e.g., body effect, intrinsic device capacitances, parasitic capacitances and so on) which must also be taken into account for a more accurate impedance control.

In some applications it may be desired to establish for the current steering devices a predefined equivalent output impedance goal which may be different from infinity. This predefined impedance level controls the amount of distortions introduced by the current steering circuit which may be used to counterbalance other distortion mechanisms present in the system for an overall improved SFDR. Thus the values of the feedback coefficients ka and kb may be selected higher or lower than calculated above.

The value of resistors 471 through 474, the size of transistor switches 481 through 484, as well as the size of steering transistors 410 and 420, are further determined by the desired current steering circuit operation parameters according to methods well established in the art.

If the current steering device 410 is a PMOS transistor, as in the example of FIG. 4, the current through the transistor has two components: a first current determined by Vgs and a second current determined by Vds. The second current will change with a change in Vds (i.e., a change in signal at output node A). Because the sum of the two currents is constant (Io), the first current will change in the opposite manner. If the gate potential remains constant, this will cause Vgs to change, thus changing the common node 432. The invention, in this example, ideally changes the gate potential exactly as much as necessary to compensate for the expected change in Vgs.

The feedback ratios ka and kb may be determined as a function of the properties of current steering devices 410 and 420 at design time or (in order to account for manufacturing process variations) may be adjusted using well known trimming techniques at manufacturing time. For even better performance (with respect to variations in temperature, power supply voltage, output load conditions, output signal amplitude, and so on), these feedback ratios may be further dynamically adjusted at power up or/and may be made to continuously track the properties of the current steering devices. The ratios may also be adjusted by the user by selecting appropriate values of components (e.g., resistors) connected to pins of an IC package, or by other means.

As an example of a preferred, but not limiting, implementation, resistors 471 and 472 may be fixed value resistors, while resistors 473 and 474 may be made (using well known active circuits) to track the properties (such as transconductance and output conductance) of replicas of the current steering transistors 410 and 420.

FIG. 5 illustrates a differential DAC 500 comprising a plurality of CS circuits CS1 through CSn steering currents to their respective output terminals A1,B1 through An, Bn, which are summed on the A and B output buses. Each CS circuit may incorporate a feedback configuration similar to that shown in FIGS. 3 and 4. The feedback transfer functions described above may differ for each CS circuit due to specific parameters and operating conditions of current steering devices comprised within. Accordingly, the level of the A and B buses does not affect the common node of each CS circuit. The result is a very low distortion DAC, enabling it to have improved SFDR performance.

While particular embodiments of the present invention have been shown and described, it will be obvious to those skilled in the art that changes and modifications may be made without departing from this invention in its broader aspects. The appended claims are to encompass within their scope all such changes and modifications as fall within the true spirit and scope of this invention.

What is claimed is:

1. A current steering circuit comprising:
   control terminals for receiving complementary steering control signals;
   a current source generating a current for being steered as directed by the complementary steering control signals;
   current steering devices selectively coupling the current source to one of two differential output nodes; and
   a plurality of feedback circuits coupling the differential output nodes to the control terminals, wherein the current steering devices present a predefined equivalent output impedance in their conductive states.

2. The circuit of claim 1 wherein the current steering devices comprise a first current steering device having a first terminal coupled to the current source at a common node and having a second terminal coupled to a first one of the differential output nodes, and a second current steering device having a third terminal coupled to the current source at the common node and a fourth terminal coupled to a second one of the differential output nodes.

3. The circuit of claim 2 wherein the current steering devices comprise MOSFETs.

4. The circuit of claim 2 wherein the current steering devices comprise bipolar transistors.

5. The circuit of claim 2 wherein the feedback circuits comprise a first feedback circuit having an input coupled to the second one of the differential output nodes and having an output coupled for adjusting a signal at a control terminal of the first current steering device, and a second feedback circuit having an input coupled to the first one of the differential output nodes and having an output coupled for adjusting a signal at a control terminal of the second current steering device.

6. The circuit of claim 5 wherein scaling functions of the feedback circuits prevent variable voltages on the differential output nodes from substantially changing a potential at the common node, causing the current steering devices to present the predefined equivalent output impedance in their conductive states.

7. The circuit of claim 1
   wherein the differential output nodes comprise a first one of the differential output nodes and a second one of the differential output nodes, and
   wherein the feedback circuits comprise a first resistor divider having an input coupled to the second one of the differential output nodes and having an output coupled for adjusting a control signal for the first current steering device, and a second resistor divider having an input coupled to the first one of the differential output nodes and having an output coupled for adjusting a control signal for the second current steering device.

8. The circuit of claim 1
   wherein the differential output nodes comprise a first one of the differential output nodes and a second one of the differential output nodes, and
   wherein the feedback circuits comprise a first voltage controlled signal source having an input coupled to the second one of the differential output nodes and having an output coupled for adjusting a control signal for the first current steering device, and a second voltage controlled signal source having an input coupled to the first one of the differential output nodes and having an output coupled for adjusting a control signal for the second current steering device.

9. The circuit of claim 1 wherein the feedback circuits comprise transistor switches.

10. The circuit of claim 1 wherein the feedback circuits comprise active signal scaling circuits.

11. The circuit of claim 1 wherein the feedback circuits comprise circuits that scale the complementary steering control signals based on a voltage level at the differential output nodes.

12. The circuit of claim 1 further comprising:
    a first switching device that receives a first one of the complementary steering control signals and controls a first one of the current steering devices to selectively couple the current source to a first one of the differential output nodes; and
    a second switching device that receives a second one of the complementary steering control signals and controls a second one of the current steering devices to selectively couple the current source to a second one of the differential output nodes.

13. The circuit of claim 12 wherein
    the first switching device couples a first control signal to the first one of the current steering devices to cause the first one of the current steering devices to be conductive to couple the current source to the first one of the differential output nodes, wherein a first one of the feedback circuits varies a magnitude of the first control signal based on a voltage level at the second one of the differential output nodes, and
    wherein the second switching device couples a second control signal to the second one of the current steering devices to cause the second one of the current steering devices to be conductive to couple the current source to the second one of the differential output nodes, wherein a second one of the feedback circuits varies a magnitude of the second control signal based on a voltage level at the first one of the differential output nodes.

14. The circuit of claim 1 wherein
the current steering devices comprise a first current steering device having a first terminal coupled to the current source at a common node and having a second terminal coupled to a first one of the differential output nodes, and a second current steering device having a third terminal coupled to the current source at the common node and a fourth terminal coupled to a second one of the differential output nodes,
wherein the feedback circuits have associated scaling functions, wherein the scaling functions of the feedback circuits prevent variable voltages on the differential output nodes from substantially changing the voltage at the common node, causing the current steering devices to present the predefined equivalent output impedance in their conductive states, and wherein the scaling factors are set by at least one of a process performed at a time of manufacturing the current steering circuit, or set at power-up time of the current steering circuit, or set by a user.

15. The circuit of claim 1 wherein
the current steering devices comprise a first current steering device having a first terminal coupled to the current source at a common node and having a second terminal coupled to a first one of the differential output nodes, and a second current steering device having a third terminal coupled to the current source at the common node and a fourth terminal coupled to a second one of the differential output nodes,
wherein the feedback circuits have associated scaling functions, wherein the scaling functions of the feedback circuits prevent variable voltages on the differential output nodes from substantially changing the voltage at the common node, causing the current steering devices to present the predefined equivalent output impedance in their conductive states, and wherein the scaling factors are set automatically during operation by at least one of tracking parameters of the current steering devices, or tracking output load conditions, or tracking output signal amplitudes.

16. The circuit of claim 1 wherein the complementary steering control signals are digital signals.

17. The circuit of claim 1 wherein the complementary steering control signals are analog signals.

18. The circuit of claim 1 wherein the two differential output nodes are coupled to differential busses of a digital-to-analog converter.

19. The circuit of claim 1 wherein the predefined equivalent output impedance is a substantially infinite equivalent output impedance.

20. A digital-to-analog converter (DAC) comprising:
a plurality of current steering circuits, each current steering circuit having two differential output nodes:
two differential output busses connected to respective ones of the differential output nodes, at least one of the current steering circuits comprising:
control terminals for receiving complementary steering control signals;
a current source generating a current for being steered as directed by the complementary steering control signals;
current steering devices selectively coupling the current source to one of the two differential output nodes; and
a plurality of feedback circuits coupling the differential output nodes to the control terminals, wherein the current steering devices present a predefined equivalent output impedance in their conductive states.

21. The DAC of claim 20 wherein
the current steering devices comprise a first current steering device having a first terminal coupled to the current source at a common node and having a second terminal coupled to a first one of the differential output nodes, and a second current steering device having a third terminal coupled to the current source at the common node and a fourth terminal coupled to a second one of the differential output nodes, and
wherein scaling functions of the feedback circuits prevent variable voltages on the differential output nodes from substantially changing the voltage at the common node, causing the current steering devices to present a substantially infinite equivalent output impedance in their conductive states.

22. The DAC of claim 21 wherein the scaling factors are set by at least one of a process performed at a time of manufacturing the current steering circuit, or set at power-up time of the current steering circuit, or set by a user.

23. The DAC of claim 21 wherein the scaling factors are set automatically during operation by at least one of tracking parameters of the current steering devices, or tracking output load conditions, or tracking output signal amplitudes.

24. The DAC of claim 20 wherein the predefined equivalent output impedance is a substantially infinite equivalent output impedance.

25. A method of steering a current between two differential output terminals, the method comprising:
generating a current;
providing control signals for a plurality of current steering devices to selectively direct the current to one of the differential output terminals; and
modulating the control signals substantially in proportion to signals present at the differential output terminals such as to maintain a predefined equivalent output impedance.

26. The method of claim 25 wherein the predefined equivalent output impedance is a substantial infinite differential output impedance.

27. A method of generating a differential analog output signal between two differential output terminals, reflective of an input digital signal, the method comprising:
generating a plurality of currents;
providing control signals for a plurality of current steering devices in response to the input digital signal in order to selectively direct the plurality of currents to one or the other of the differential output terminals; and
modulating at least one of the control signals in proportion to signals present at the differential output terminals such as to substantially eliminate distortions of the differential analog output signal.

* * * * *